United States Patent
Brox et al.

(10) Patent No.: US 6,996,026 B2
(45) Date of Patent: Feb. 7, 2006

(54) DEVICES FOR SYNCHRONIZING CLOCK SIGNALS

(75) Inventors: Martin Brox, München (DE); Alessandro Minzoni, Morrisville, NC (US)

(73) Assignee: Infineon Technologies AG, Munich (DE)

( * ) Notice: Subject to any disclaimer, the term of this patent is extended or adjusted under 35 U.S.C. 154(b) by 56 days.

(21) Appl. No.: 10/834,383

(22) Filed: Apr. 29, 2004

(65) Prior Publication Data
US 2004/0251939 A1    Dec. 16, 2004

(30) Foreign Application Priority Data
Apr. 30, 2003   (DE) ................................ 103 20 792

(51) Int. Cl.
*G11C 8/00*        (2006.01)
(52) U.S. Cl. ...................................... 365/233; 365/194
(58) Field of Classification Search ............... 365/233, 365/194; 327/158
See application file for complete search history.

(56) References Cited

U.S. PATENT DOCUMENTS

| | | | |
|---|---|---|---|
| 5,939,913 A | 8/1999 | Tomita | |
| 6,100,733 A * | 8/2000 | Dortu et al. | 327/149 |
| 6,212,127 B1 * | 4/2001 | Funaba et al. | 365/233 |
| 6,298,004 B1 * | 10/2001 | Kawasaki et al. | 365/233 |
| 6,346,839 B1 * | 2/2002 | Mnich | 327/158 |
| 6,538,957 B2 | 3/2003 | Magoshi | |

FOREIGN PATENT DOCUMENTS

EP       0964517       12/1999

* cited by examiner

*Primary Examiner*—Anh Phung
(74) *Attorney, Agent, or Firm*—Morrison & Foerster LLP

(57) ABSTRACT

A clock signal synchronizing device includes a first delay unit with variable delay time connected to an input circuit with a first delay time which receives a first clock signal and outputs a second clock signal. A second delay unit has a fixed delay time portion corresponding to the first delay time, and an additional variable delay time portion. A first phase comparison unit has a first input connected to the output of the input circuit, and a second input connected to the output of the second delay unit. The output signal controls the delay time of the first delay unit. A copy of the input circuit has an input connected to the output of the first delay unit. A second phase comparison unit has an input connected to the output of the copy, and an output signal controls the variable delay time portion of the second delay unit.

13 Claims, 11 Drawing Sheets

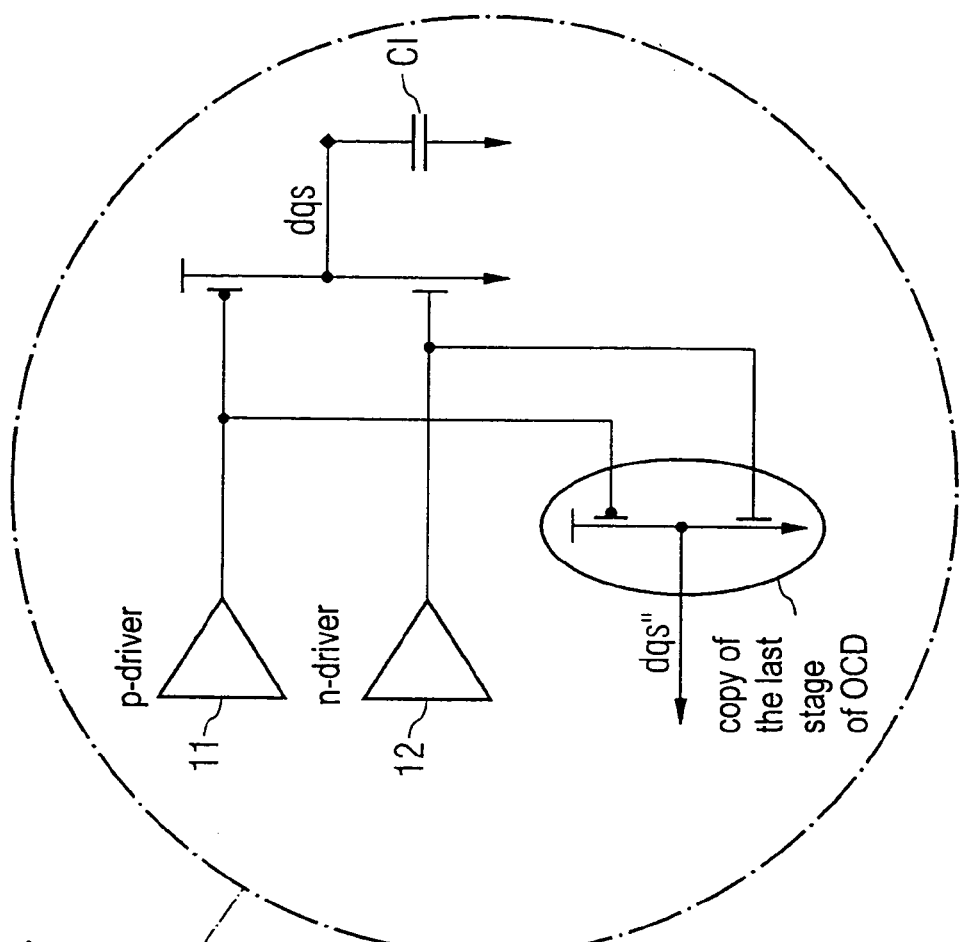
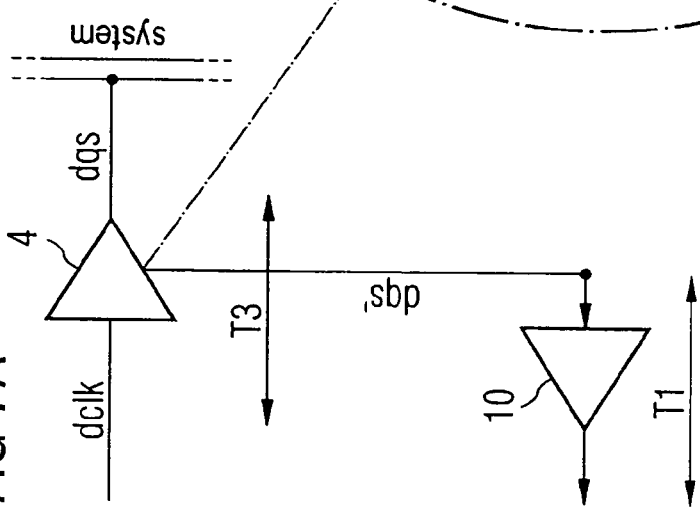

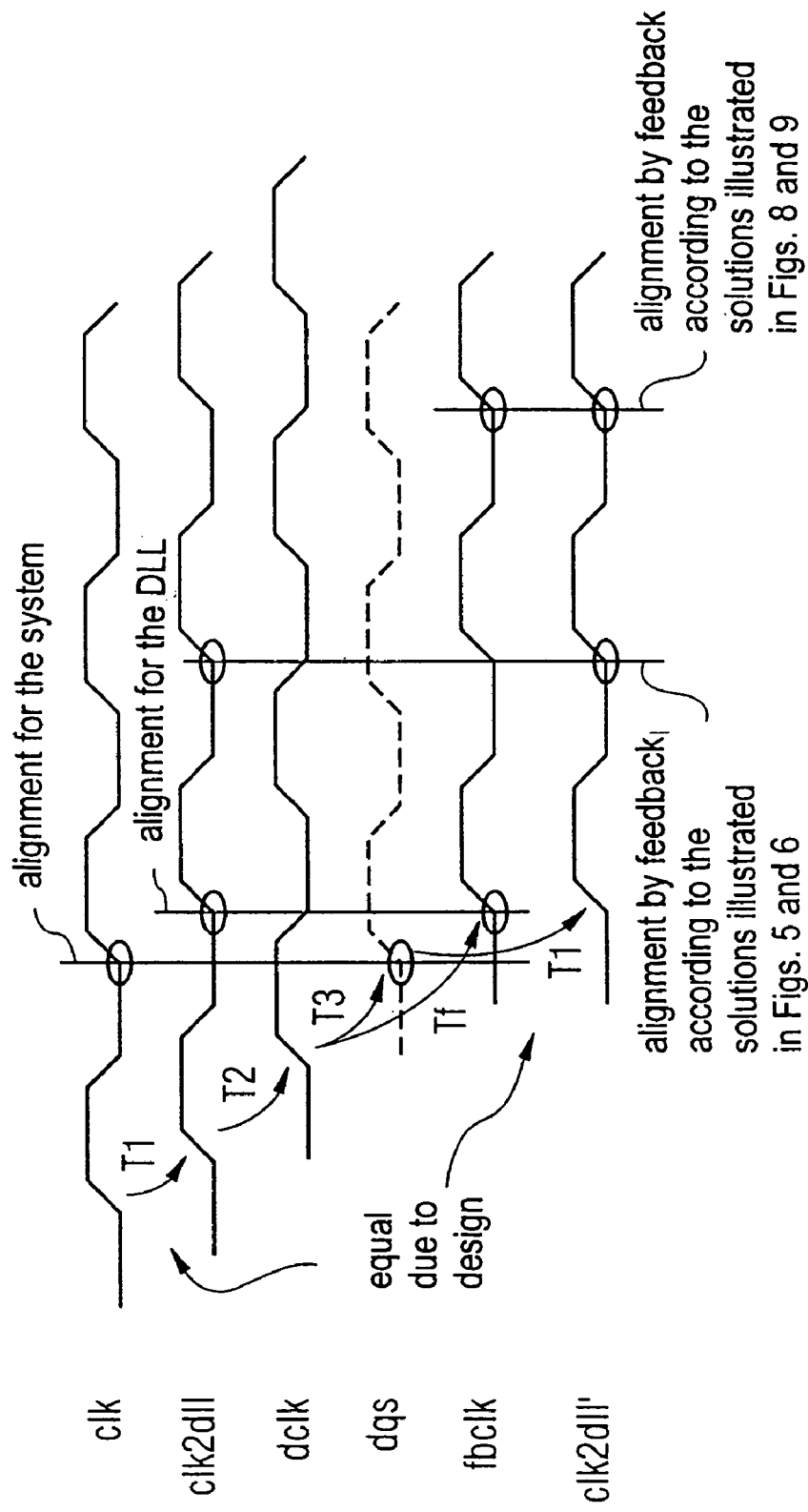

DEVICES FOR SYNCHRONIZING CLOCK SIGNALS

CLAIM FOR PRIORITY

This application claims priority to German Application No. 103 20 792.9 filed Apr. 30, 2003, which is incorporated herein, in its entirety, by reference.

TECHNICAL FIELD OF THE INVENTION

The invention relates to devices for synchronizing clock signals, and in particular to devices for synchronizing a data strobe of a memory chip with a clock signal externally input in the memory chip.

BACKGROUND OF THE INVENTION

Synchronous dynamic semiconductor memories with random access (SDRAM), and in particular SDRAM with double data rate (DDR-SDRAM), output, during reading out, their data (for which the abbreviation "DQ" is used) synchronously to a clock signal output by the memory. This clock signal, which is also referred to as data strobe and is usually abbreviated as "DQS", in turn has to be synchronous to a clock signal (CLK) input externally in the memory. The external clock signal is generated by devices connected to the memory and communicating therewith and conveying the read instruction to the memory, the devices being, to facilitate matters, referred to as "system" in the following. The system may, for instance, include a processor. To the external clock signal CLK or the data strobe DQS, respectively, there are simultaneously generated respective complementary signals that are referred to as BCLK or BDQS, respectively. FIG. 1 shows, in a time flowchart, the external clock signal (CLK) with its complementary (BCLK), the data strobe with its complementary (BDQS), and the data signal (DQ) together with the synchronization between data strobe and data signal, and the synchronization between data strobe and external clock signal.

Known DDR-SDRAM memories comprise a device for synchronizing the data strobe generated from the external clock signal with the external clock signal, having, as a rule, a simple DLL-circuit (delay-locked-loop circuit). Such a circuit is, for instance, known from EP 964 517 and is illustrated in FIGS. 2 and 3.

The SDRAM chip illustrated in the top portion of FIG. 2 receives an external clock signal CLK as well as a complementary clock signal BCLK from a system. The clock signal received constitutes a differential clock signal and is converted to two single-ended clock signals via the receivers 1 and 2, wherein only the signal that is designated with CLK2DLL is looked at in FIG. 2 for reasons of clarity. The receiver delays the clock signal received by a predetermined delay time T1. By the DLL circuit 7 that is connected to the output of the receiver 1, the clock signal is delayed by a further variable delay time T2, so that the clock signal DCLK results. The clock signal DCLK is then delayed by a further delay time T3 via an off-chip-driver 4 positioned on the memory chip, and is then output from the memory chip to the system as data strobe during the reading out of data. A perfect synchronization between the external clock CLK and the data strobe DQS results when equation 1

$$T1+T2+T3=n*Tp \quad (1)$$

is fulfilled, where Tp is the clock period of an external clock signal and n is an integer that is larger than or equal to 1. The variable delay time T2 is adjusted by the DLL such that equation 1 is fulfilled, which is represented in the time flowcharts of the clock signals in FIG. 2 at the bottom.

FIG. 3 illustrates the detailed construction of the known DLL circuit 7 of FIG. 2. The known DLL circuit comprises a first delay unit 3 with a variably adjustable delay that receives the clock signal from the receiver and delays same by a variable time T2 and transfers it to the off-chip-driver. The DLL circuit moreover possesses a second delay unit 6 adjusted to a fixed desired delay time that corresponds approximately to the sum (T1f+T3f) of the delay T1 of the receiver and the delay T3 of the off-chip-driver. Due to this fed-back reference delay in the second delay unit, the DLL is capable of performing the clock synchronization. The output signal FBCLK of the second delay unit 6 is compared with respect to its phase in a phase detector 5 with the clock signal CLK2DLL output by the receiver. When there are differences with respect to the phasing between the signals CLK2DLL und FBCLK, the phase detector outputs a corresponding output signal to the first delay unit, this causing the delay time T2 to be corrected such that equation 1 is fulfilled. In a time flowchart in the lower portion of FIG. 3, how the signals FBCLK and CLK2DLL are first of all aligned with respect to one another for the DLL is illustrated, this resulting, later on, in the alignment between the signals CLK and DQS which is also represented in FIG. 3 at the bottom by a vertical line connecting corresponding states of the clock signals.

The quality of synchronization of these clock synchronization circuits known in prior art substantially depends on the exactness of the fixed desired delay time of the second delay unit. A relatively good synchronization can be achieved when simply copies of the receiver and of the off-chip-driver are connected in series as delay elements in the second delay unit. This solution is, however, not advantageous since it requires a large layout region and, moreover, necessitates a great deal of current. An alternative solution with low current consumption and little requirement of layout region would be an inverter chain which, however, has the disadvantage that it is highly dependent on the semiconductor manufacturing process and on fluctuations in voltage supply result, so that this solution is also not ideal.

There are, however, further important disadvantages with the devices for synchronizing clock signals known in prior art and described above. Thus, for instance, fluctuations in the supply voltage of the receiver or of the off-chip-driver will add additional deviations to the delay times of these devices. What is most problematical is, however, the fact that the dependency of the time delay T3 on the capacitive and/or ohm resistive load available at the output of the SDRAM chip, which can differ depending on the respective use of the chip, cannot be taken into account in the DLL control circuit. Varying casings of the chip which may have an influence on the delay times cannot be taken into account, either.

The negative effect that the described fluctuations of the delay times of the individual devices, which are important for the determination of the total delay time resulting in accordance with equation 1, can have is illustrated in FIG. 4, where the data strobe DQS can no longer be aligned to the external clock signal CLK. Due to the fluctuations of the delay times, the fixedly adjusted delay time Tf of the second delay unit 8 does no longer corresponds to the sum of the delay times T1 and T3 that are actually introduced by the receiver or the off-chip-driver, respectively.

By means of such deviations in time, the time window for reading out the data, the so-called data eye, which is created by the overlapping of corresponding logic states of data strobe and data signal, becomes smaller, and a reliable reading out of the data from the memory chip to the system may become impossible. This particularly has an effect with memories with double data rate (DDR) where one data bit is addressed with the rising clock edge and one with the falling clock edge.

SUMMARY OF THE INVENTION

It is an object of the invention to provide novel devices for synchronizing clock signals which eliminate the described disadvantages of corresponding previous devices at least partially.

According to an aspect of the invention, a device for synchronizing clock signals is provided. This device comprises a first delay unit with variably controllable delay time, the input of which is connected to the output of an input circuit comprising a first delay time, the input circuit receiving a first clock signal, wherein the first delay unit outputs at its output a second clock signal that is to be synchronized with the first clock signal. The device further includes a second delay unit comprising a fixed delay time portion corresponding approximately to the first delay time, and an additional variably controllable delay time portion, and which is connected at its input to the output of the first delay unit. Further included is a first phase comparison unit, the first input of which is connected to the output of the input circuit, and the second input of which is connected to the output of the second delay unit, and the output signal of which controls the delay time of the first delay unit. The device further includes a copy of the input circuit, the input of which is connected to the output of the first delay unit, and a second phase comparison unit, the first input of which is connected to the output of the input circuit, and the second input of which is connected to the output of the copy of the input circuit, and the output signal of which controls the variable delay time portion of the second delay unit.

According to another aspect of the invention, a device for synchronizing clock signals is provided which includes a first delay unit with variably controllable delay time, the input of which is connected to the output of an input circuit comprising a first delay time, the input circuit receiving a first clock signal, wherein the first delay unit outputs at its output a second clock signal that is to be synchronized with the first clock signal, a second delay unit comprising a fixed delay time portion corresponding approximately to the first delay time, and an additional variably controllable delay time portion, and which is connected at its input to the output of the first delay unit, a first phase comparison unit, the first input of which is connected to the output of the input circuit, and the second input of which is connected to the output of the second delay unit, and the output signal of which controls the delay time of the first delay unit, a copy of the input circuit, the input of which is connected to the output of the first delay unit, and a second phase comparison unit, the first input of which is connected to the output of the second delay unit, and the second input of which is connected to the output of the copy of the input circuit, and the output signal of which controls the variable delay time portion of the second delay unit.

BRIEF DESCRIPTION OF THE DRAWINGS

FIG. 7 is a detail of the block circuit diagram illustrated in FIG. 6 in two differently magnified detail views, FIG. 10 shows time diagrams of clock signals for explaining the synchronization methods used with the embodiments of the devices according to an aspect of the invention as illustrated in FIGS. 5–9.

DETAILED DESCRIPTION OF THE INVENTION

Figure 5:
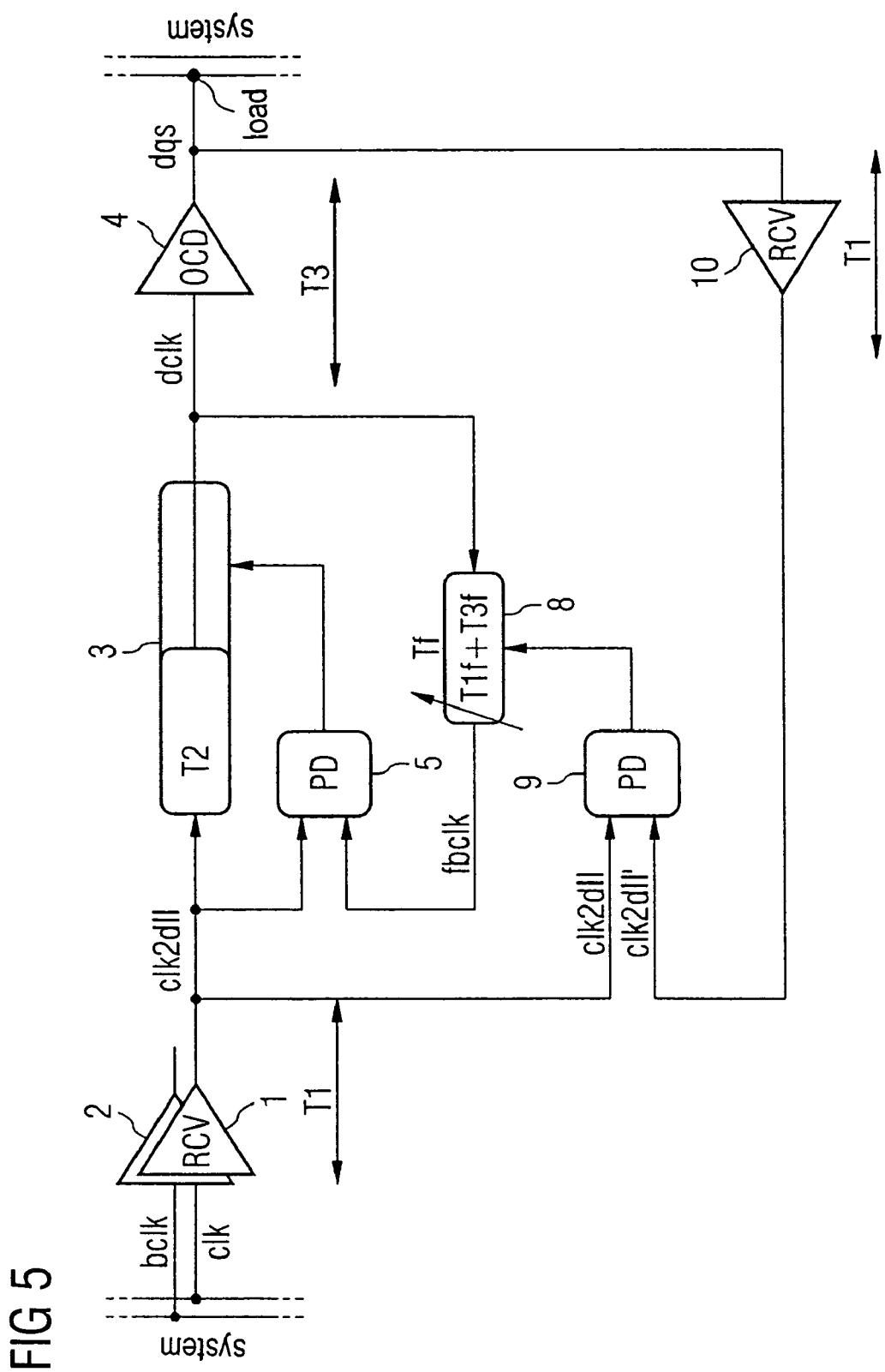
FIG. 5 is a block circuit diagram of a first embodiment of a first device for synchronizing clock signals in accordance with an aspect of the invention.

FIG. 5 is a block circuit diagram of a first embodiment of a first device for synchronizing clock signals in accordance with the invention. This device is explained by means of its use with a DDR-SDRAM chip, where it is the object of synchronizing an external clock signal CLK predetermined by the system with a data strobe DQS that has been generated on the DDR-SDRAM chip and has been transferred to the system so as to enable the reading out of data from the DDR-SDRAM chip.

The DDR-SDRAM chip receives an external clock signal CLK from a system that may, for instance, include a processor. Preferably, a further clock signal BCLK that is complementary to the external clock signal can also be received on the input side of the memory chip when differential clock input signals are used. For generating a single-ended clock signal CLK2DLL on the chip from the received differential clock signal, two so-called receivers 1 and 2 are provided which receive the signals CLK and BCLK respectively, and convert same to a single-ended clock signal and a single-ended clock signal complementary thereto on the chip. The receivers that are known in prior art may, for instance, includes differential amplifiers with unsymmetrical output which serve, among others, also for level adjustment during the receipt of the clock signals. Since the exact functioning of the receivers is of no significance for the description of the invention, it will not be dealt with here in detail. In the following, moreover, only the non-complementary clock signal CLK and its further development on the chip will be discussed since the reflections apply in analogy with respect to the complementary clock signal BCLK. The receiver is only one example of any input circuit of the chip that can serve to receive the external clock signal and adds a particular relatively fixed time delay T1 to the clock signal CLK, so that the clock signal CLK2DLL results at the output of the input circuit, which is delayed vis-à-vis the signal CLK by T1.

At the output of the DDR-SDRAM chip there is positioned, as with the device known from the above-described prior art, an off-chip-driver 4 which adds a further delay time T3 to the clock signal received. At the output of the off-chip-driver 4, a capacitive and/or ohm resistive load is applied, which is dependent on the concrete system to which the memory chip is to be connected. The off-chip-driver 4 may also be replaced by any other output circuit that enables the transfer of the data strobe DQS to the system and, moreover, only introduces a further clock delay T3. The output circuit is, however, not absolutely necessary for the functioning of the invention and may optionally also be omitted with different embodiments.

The embodiment of the first device for synchronizing clock signals in accordance with the invention as illustrated in FIG. 5 comprises a first delay unit 3, a second delay unit 8, a first phase detector 5, a second phase detector 9, and a copy 10 of the input receiver 1.

The first delay unit 3 comprises a variably controllable delay time T2. The input of the first delay unit is connected to the output of the input circuit 1 comprising a first delay time T1, i.e. the receiver. The first delay unit 3 is at its output connected to the input of the off-chip-driver 4.

The second delay unit 8 substantially serves to simulate the receiver and the off-chip-driver with respect to their time delays. The second delay unit 8 therefore comprises a fixed delay time portion T1f which corresponds approximately to the sum of the first delay time T1 of the receiver 1 and the further delay time T3 which is introduced by the off-chip-driver 4. In the above-described embodiment, in which the output circuit 4 is missing, the delay time portion T1f would merely correspond approximately to the delay time T1 of the input circuit 1.

The second delay unit 8 moreover comprises an additional variably controllable delay time portion. The input of the second delay unit 8 is connected to the output of the first delay unit 3.

The first input of the first phase detector 5 is connected to the output of the input circuit 1 while the second input of the first phase detector 5 is connected to the output of the second delay unit 3. The output of the first phase detector 5 is connected to the control input of the first delay unit 3. The output signal output by the first phase detector controls the variable time delay T2 adjusted by the first delay unit 3.

A copy 10 of the input circuit, i.e. of the receiver 1, is connected between the output of the off-chip-driver 4 and an input of the second phase detector 9. The copy of the receiver 1 exactly corresponds to the receiver 1 and has been manufactured under the same process conditions and with the same layout parameters. It is, moreover, operated with the supply of the receiver 1. The copy 10 hence has the same time delay T1 as the receiver 1.

In the above-described embodiment, which can do without the output circuit 4, the copy 10 of the input circuit would be connected directly between the output of the first delay unit 3 and the one input of the second phase detector 9.

The other input of the second phase detector 9 is connected to the output of the input circuit 1, and the output signal of the second phase detector 9 controls the variable delay time portion of the second delay unit 8.

Figure 1:
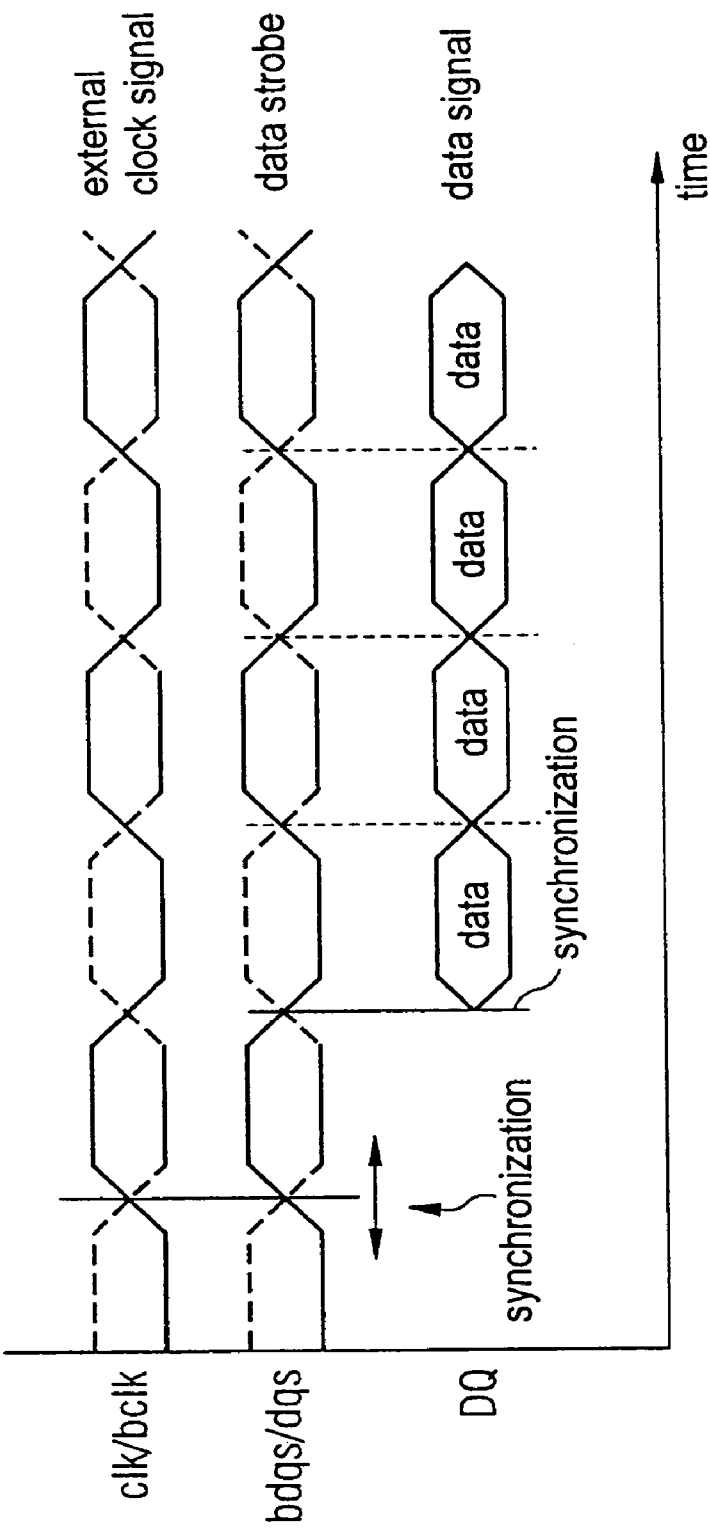
FIG. 1 illustrates time flowcharts of the input and output signals of an SDRAM chip known in prior art.
Figure 2:
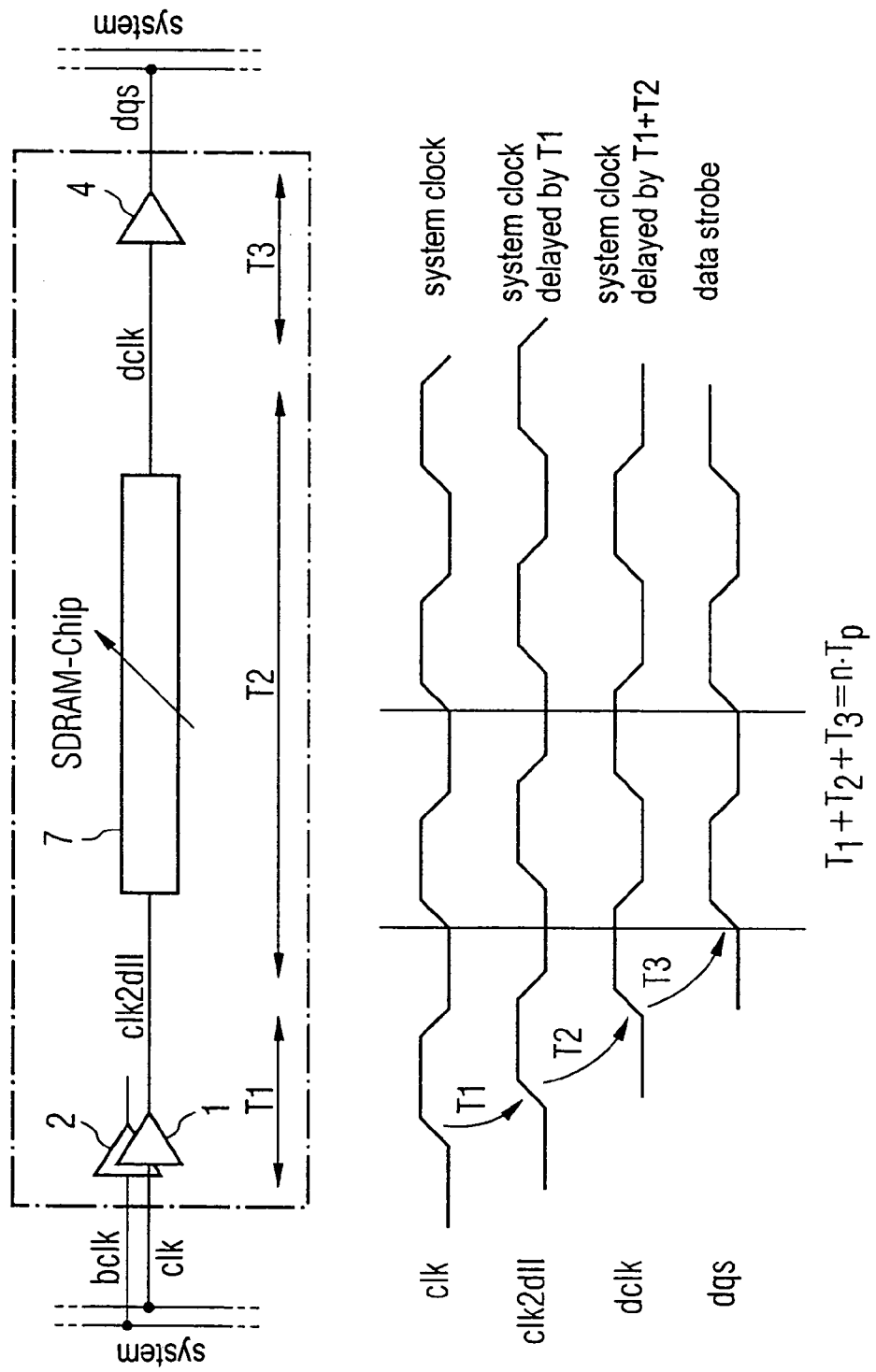
FIG. 2 illustrates a device for synchronizing an external clock signal with a clock signal generated on the chip, used with an SDRAM chip and known in prior art.
Figure 3:
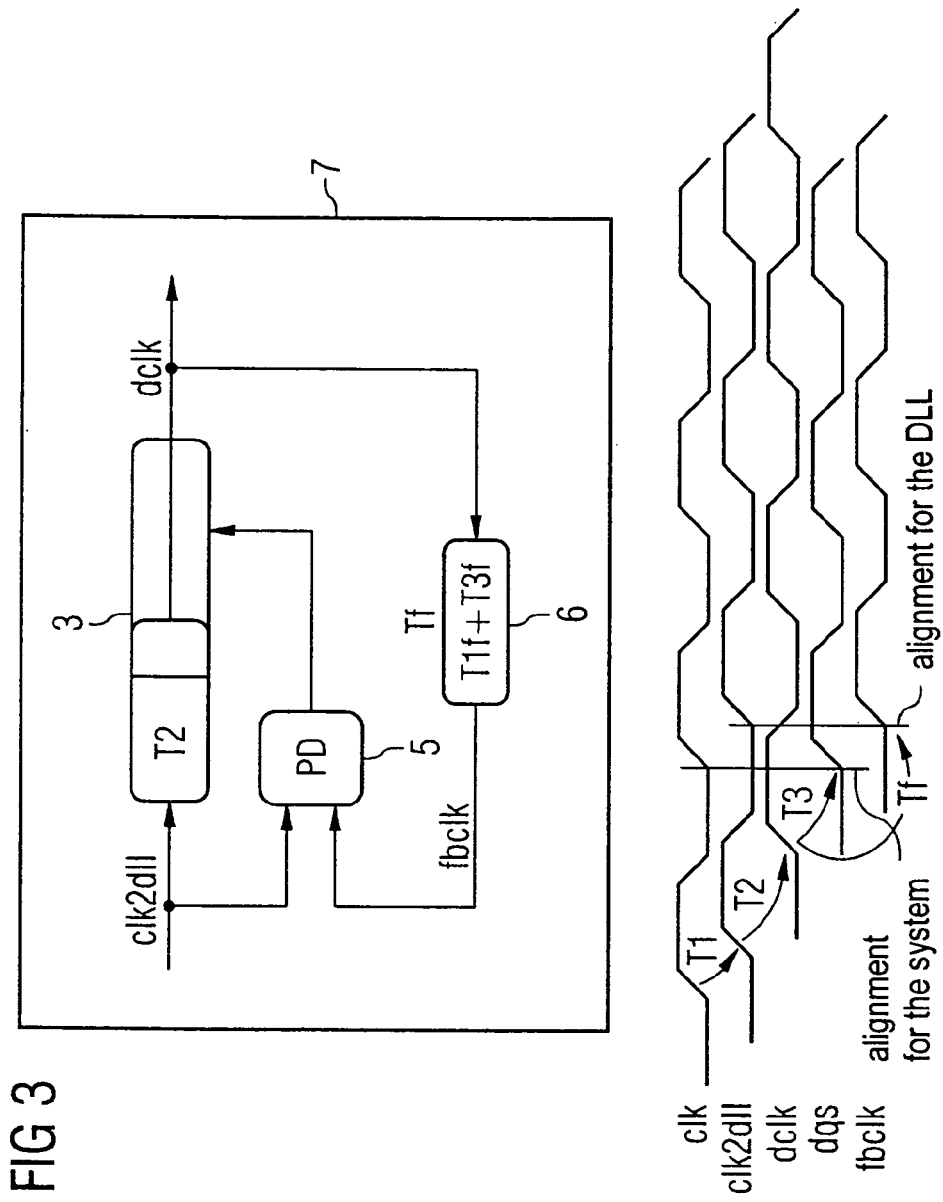
FIG. 3 is a block circuit diagram of a DLL circuit used with the chip illustrated in FIG. 2.
Figure 4:
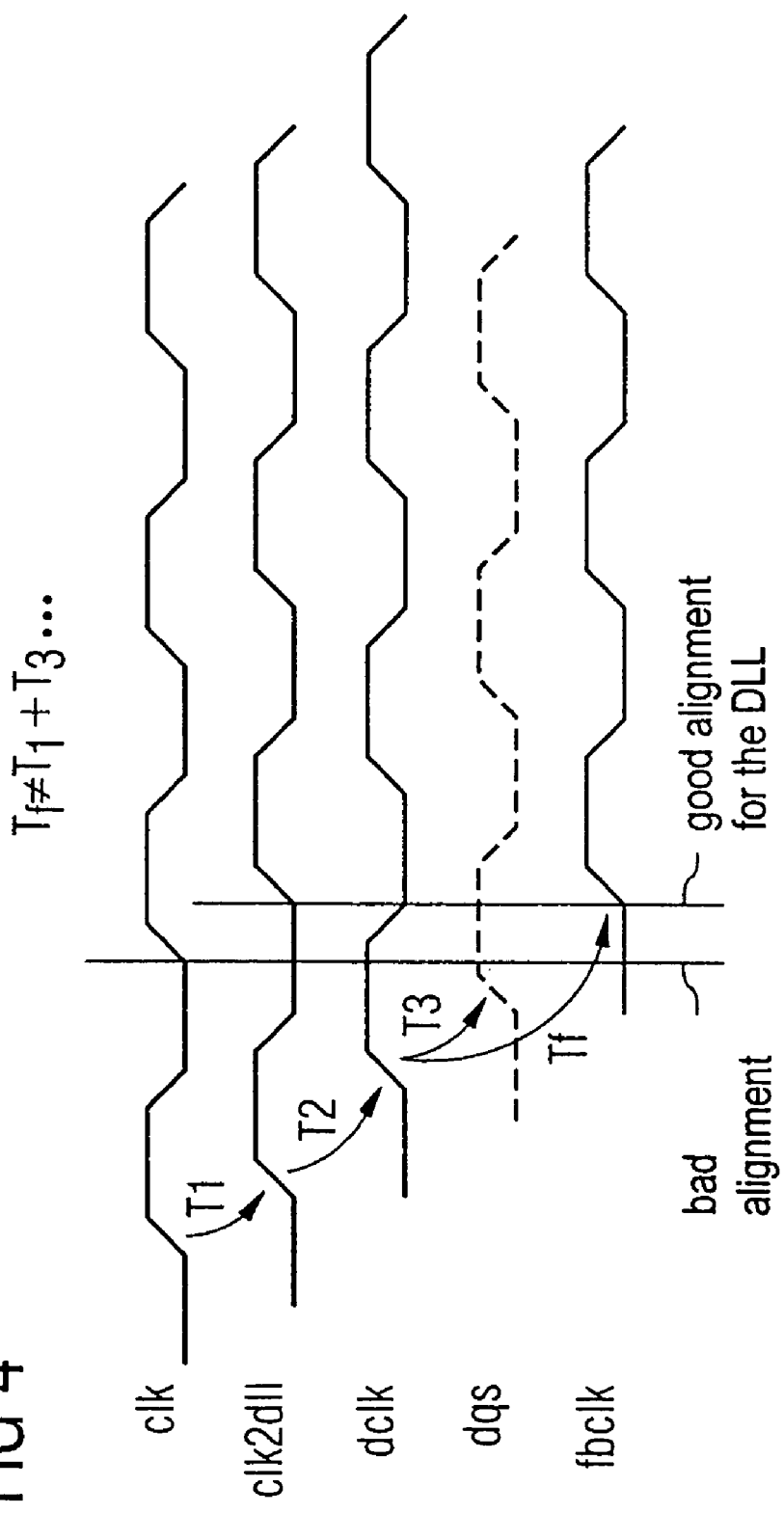
FIG. 4 shows time diagrams of clock signals for explaining a state of lacking synchronization with a synchronization circuit known in prior art.

As compared to the above-described solution known from prior art and illustrated in FIGS. 2 and 3, the substantial differences of the solution according to the invention as illustrated in FIG. 5 includes:
  the use of an exact copy of the input circuit,
  the use of a second phase detector that compares a clock signal CLK2DLL originating from the input circuit with a clock signal CLK2DLL' derived from the output of the off-chip-driver and guided via the copy of the input circuit, and outputs a control signal, and
  a modified second delay unit comprising a variable delay time portion that can be controlled via the control signal of the second phase detector.

By this, in addition to the first control loop that includes the DLL (3, 5, 8), a further control loop (1, 8, 9, 10) is introduced which enables a more exact synchronization between the input clock signal CLK and the data strobe DQS.

A substantial advantage of this solution vis-a-vis previous solutions is that the influence of a capacitive and/or ohm resistive load, selected by the user, on the delay time that is introduced by the delay time chain and, in particular, the off-chip-driver, can be taken into account. This is advantageous especially for the manufacturers of memory chips such as DDR-SDRAM memory chips since, when the chip is delivered, it is, as a rule, not known with which ohm resistive and/or capacitive load a customer acquiring the chip will be working later on. Moreover, with this solution, fluctuations in the supply voltage of the receiver 1 and of the off-chip-driver 4 and their influences on the delay times T1 and T3 will also be taken into account since these may be corrected by the second control loop by the delay time Tf of the second delay unit being readjusted appropriately.

Figure 11A:
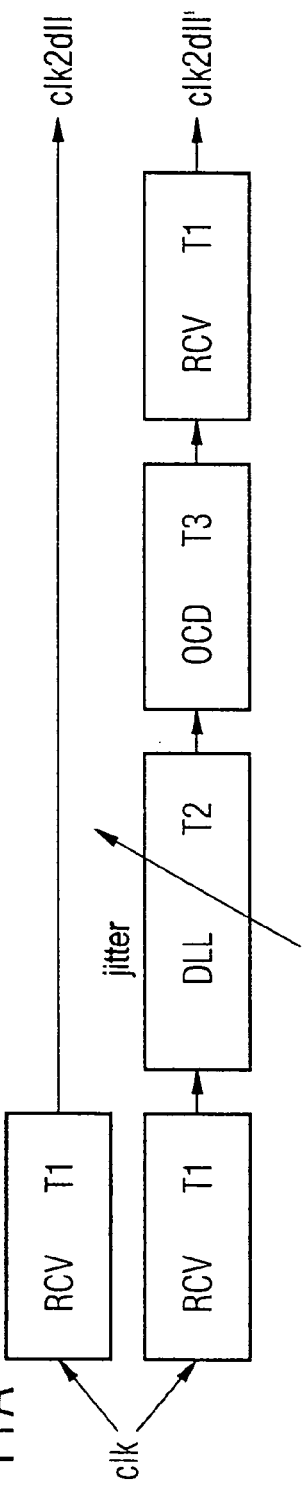
FIG. 11 shows diagrams for comparison of the two devices for synchronizing clock signals in accordance with an aspect of the invention as illustrated in FIGS. 5–9.
Figure 11B:
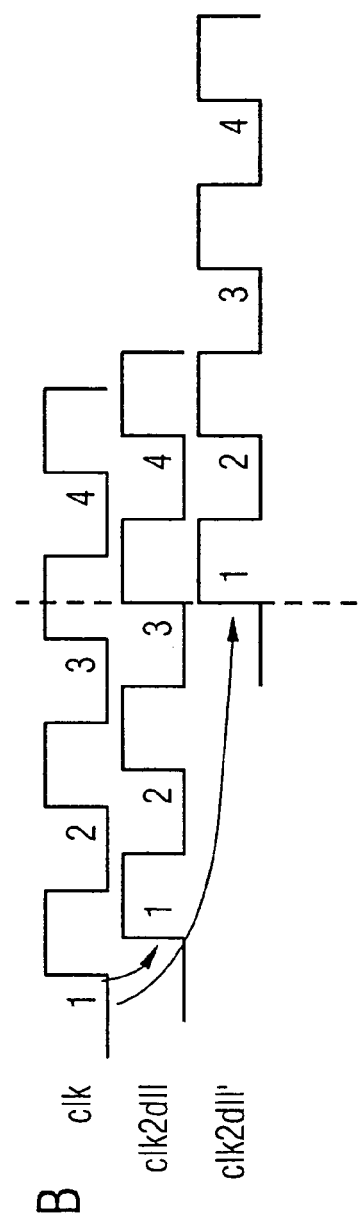

The device illustrated in FIG. 5 functions such that the control loop predetermined by the DLL (3, 5, 8) is first of all adjusted without the time Tf being readjusted by the second control loop (1, 9, 10, 8). Once the DLL has been adjusted, the second control loop compares the delay time T1 (CLK2DLL) that is introduced by the input circuit 1 with the delay time (DLKDLL') defined by the chain from the input circuit 1 (receiver), the second delay unit 2, the output circuit 3 (off-chip-driver), and the copy 10 of the input circuit (receiver copy) by means of a phase comparison, which is illustrated in FIGS. 11a and 11b. When phase shifts between CLK2DLL und CLK2DLL' are detected, which may, for instance, be introduced by modifications of the supply voltage of the receiver or modifications of the load, the time Tf of the second delay unit is corrected, so that, in a further step, the delay time T2 is, gradually via the DLL, also adjusted to a new improved value so as to re-establish the synchronization between CLK and DQS clock signals.

As compared to previous systems, an improved and more exact synchronization can thus be achieved between the external clock signal CLK and the data strobe clock signal DQS with the device illustrated in FIG. 5, this enabling, in particular with DDR-SDRAMs, a more exact reading out of the data since the data eye is enlarged.

FIG. 10 clearly shows a comparison in time of all the clock signals CLK, CLK2DLL, DCLK, DQS, and CLK2DLL' of FIG. 5, with the two control steps of the solution represented in FIG. 5 being illustrated by the vertical second and third lines (viewed from the left). First of all—indicated by the second vertical line from the left—an alignment for the DLL is performed, and in a second step the alignment via the feedback—indicated by the third vertical line from the left.

A slight disadvantage with the device for synchronizing clock signals in accordance with the invention as illustrated in FIG. 5, however, is that an exact synchronization control via the two control loops that are connected to one another is only possible during the actual reading out of data from the DDR-SDRAM since, during the time when no data are read out, influences of the capacitive and/or ohm resistive load connected to the output of the memory chip cannot be taken into account. This means, however, that directly when a read-out instruction is conveyed from the system to the memory chip, first of all only a relatively bad synchronization between the clock signals can exist which will, however, be improved "abruptly" when the control loops have been in operation during the starting of the reading out and have been able during synchronization to also take into account the influence of the capacitive and/or ohm resistive load resulting during the reading out at the output of the memory chip.

This effect might, for instance, be eliminated by a short "dead time" being, as a standard, switched between the read-out instruction and the actual reading out of data, during which the reading out of data is not yet started so as to give the control system sufficient time to adjust to the modified load conditions and to achieve good synchronization.

Figure 6:
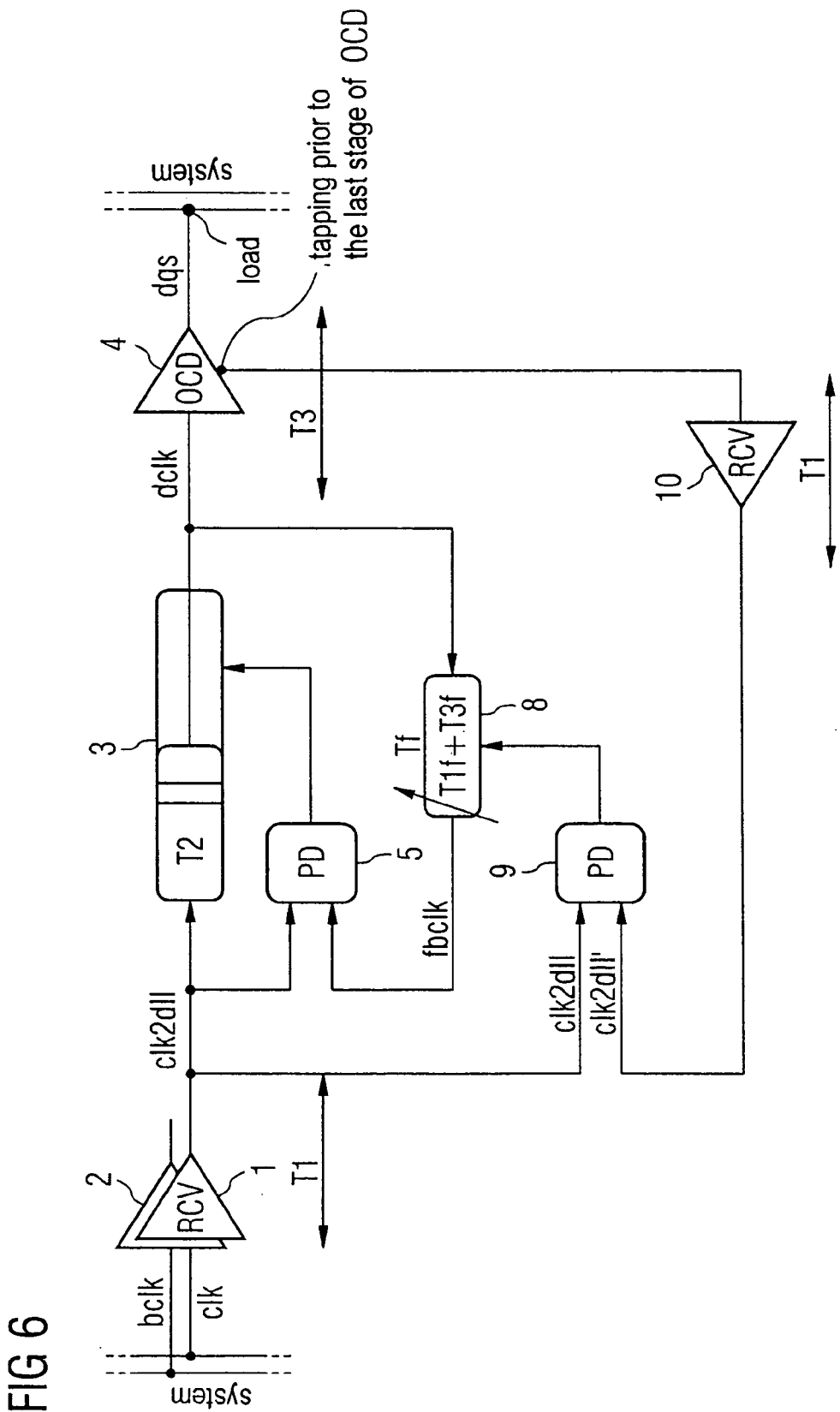
FIG. 6 is a block circuit diagram of a second embodiment of a first device for synchronizing clock signals in accordance with the an aspect of the invention.

FIG. 6 moreover illustrates a block circuit diagram of a second embodiment of the first device for synchronizing clock signals in accordance with the invention, by means of which this negative effect that results from the non-consideration of the load prior to reading out is reduced. Since the device for synchronizing clock signals illustrated in FIG. 6 deviates only very slightly from the device illustrated in FIG. 5 and described above, only the differences between the two devices will be described in the following.

It is assumed that the off-chip-driver 4, i.e. the output circuit, includes a plurality of circuit stages, e.g. a plurality of stages of an amplifier. The input of the copy 10 of the input circuit (receiver 1) now is not connected to the output of the off-chip-driver (such as in FIG. 5), but to the output of the penultimate circuit stage of the off-chip-driver 4, which is illustrated in FIG. 7a and, in more detail, in FIG. 7b. An exact copy of the last stage of the off-chip-driver is, however, connected between the output of the penultimate circuit stage of the off-chip-driver 4 and the input of the copy 10 of the input circuit, so as to consider the time delay portion of T3 also in the second control loop, which is introduced by the last circuit stage of the off-chip-driver 4. The penultimate circuit stage of the off-chip-driver illustrated in FIG. 7b includes a p-driver and an n-driver while the last circuit stage includes two MOS-FETs that are addressed by the penultimate circuit stage. A copy of the last stage of the off-chip-driver 4 has been connected between the output of the penultimate circuit stage of the off-chip-driver and the input of the copy of the receiver 1—as can be recognized from FIG. 7b.

A disadvantage of the embodiment of the invention illustrated in FIG. 6 is that the relevant influences with respect to time of the capacitive (see C1 in FIG. 7b) and/or ohm resistive loads being available at the output of the memory chip and influencing the delay time T3 of the off-chip-driver can now no longer be taken into account in the control. The advantage is that the circuit enables good synchronization between the input clock signal CLK and the data strobe DQS even when no reading-out from the memory chip is performed, i.e. in particular also that no dead times have to be considered after the read-out instruction. As compared to previous synchronizing devices that are known in the prior art, a great advantage does, however, still is that, in addition to influences on the receiver 1, influences e.g. of the supply voltage on the off-chip-driver on the delay time T3 and thus on the synchronization can be taken into account and can be corrected so as to achieve better synchronization between the input clock signal CLK and the data strobe DQS.

Figure 8:
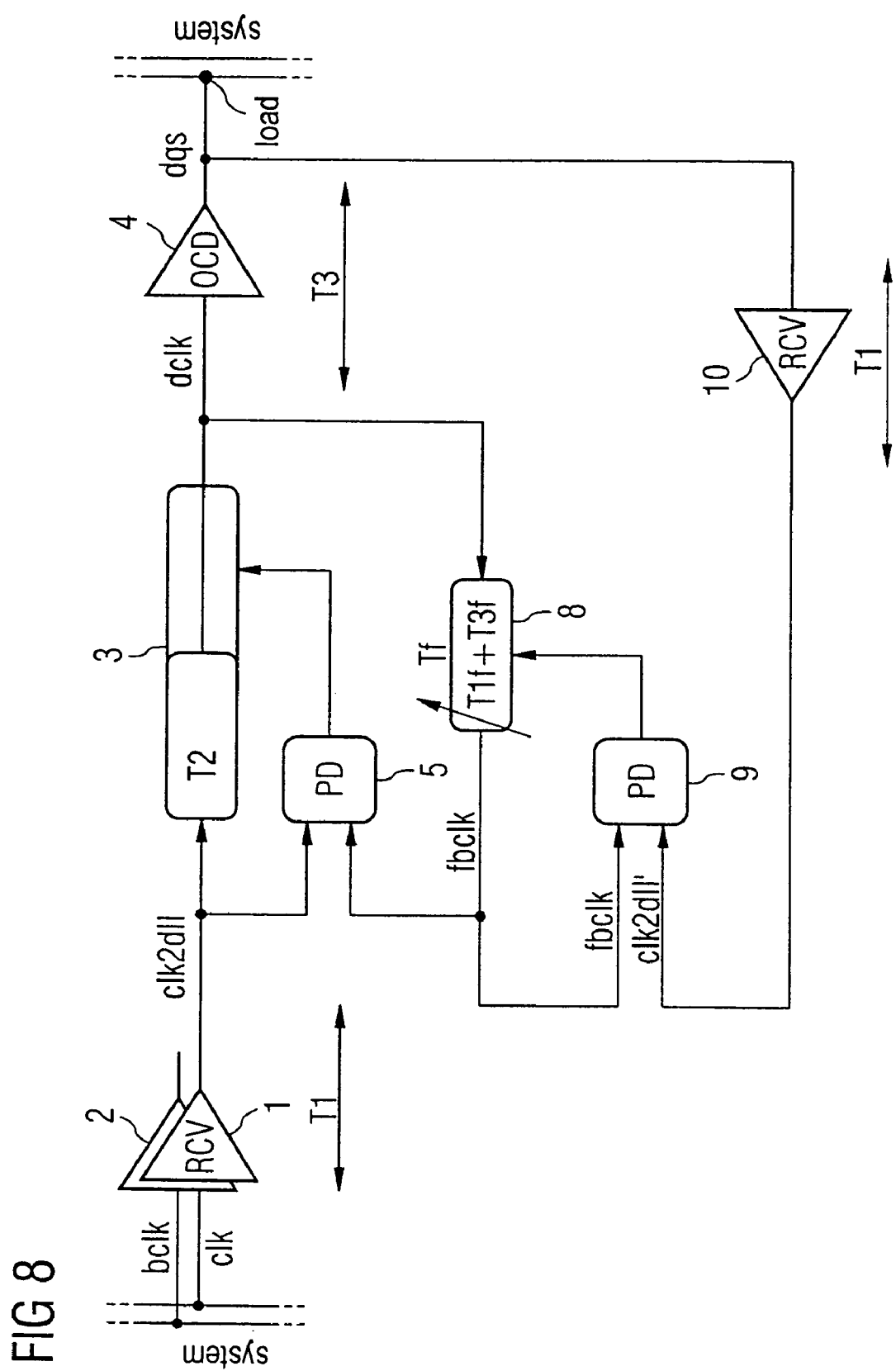
FIG. 8 is a block circuit diagram of a first embodiment of a second device for synchronizing clock signals in accordance with an aspect of the invention.

FIG. 8 illustrates a block circuit diagram of a first embodiment of a second device for synchronizing clock signals according to the invention.

Since the second device for synchronizing clock signals in accordance with the invention only comprises minor differences vis-à-vis the device for synchronizing clock signals as illustrated in FIG. 5 and described above, only those differences will be described in the following.

The only difference here is that the one input signal of the second phase detector 9 is not (as in FIG. 5 (=CLK2DLL)) derived from the output of the input circuit 1, but from the output of the second delay unit 8. The derived signal is designated with FBCLK in FIG. 8. The other input signal of the phase detector 9 is here, too, delivered by the output of the copy of the input circuit.

Figure 11C:
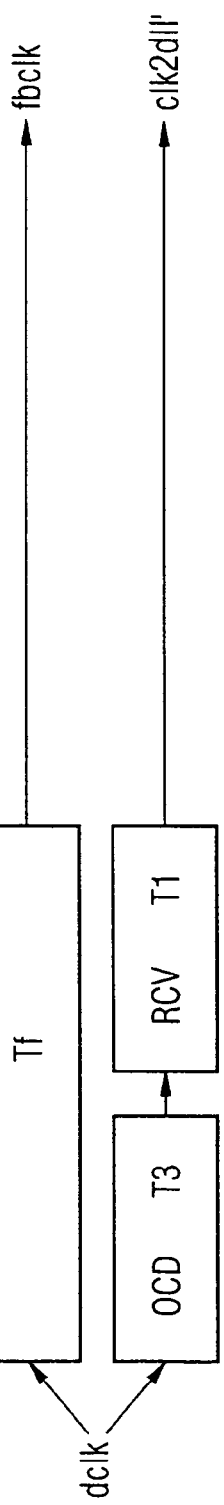

By that, a different form of the second control loop can be realized, which is clearly illustrated in FIG. 11c. The second phase detector 9 now once compares the signal DCLK originating from the output of the first delay unit 3 after delay by the second delay unit 8 (i.e. delayed by the desired value (T1f+T3f)) with the signal DCLK after delay by the off-chip-driver 4 and the copy 10 of the receiver, i.e. delayed by T3+T1. By this comparison, too, deviations can thus be corrected which exist between the simulated sum of T1f and T3f adjusted by the second delay unit and the actual delay times T1 (receiver) und T3 (off-chip-driver) and may, for instance, be caused by influences of the supply voltage or the load at the output of the memory chip. Also with the device illustrated in FIG. 8 can the output circuit 4 be omitted optionally.

With the solution illustrated in FIG. 8, the control is performed in the DLL, and simultaneously the feedback control introduced by the elements 8 and 9.

FIG. 10 clearly shows a comparison in time of all the clock signals CLK, DCLK, DQS, CLK2DLL' and FBCLK of FIG. 6, with the two control steps of the solution represented in FIG. 8 being illustrated by the vertical second and fourth lines (viewed from the left). Here, an alignment for the DLL is performed—indicated by the second vertical line from the left—and, in parallel, the alignment via the feedback—indicated by the fourth vertical line from the left.

Figure 9:
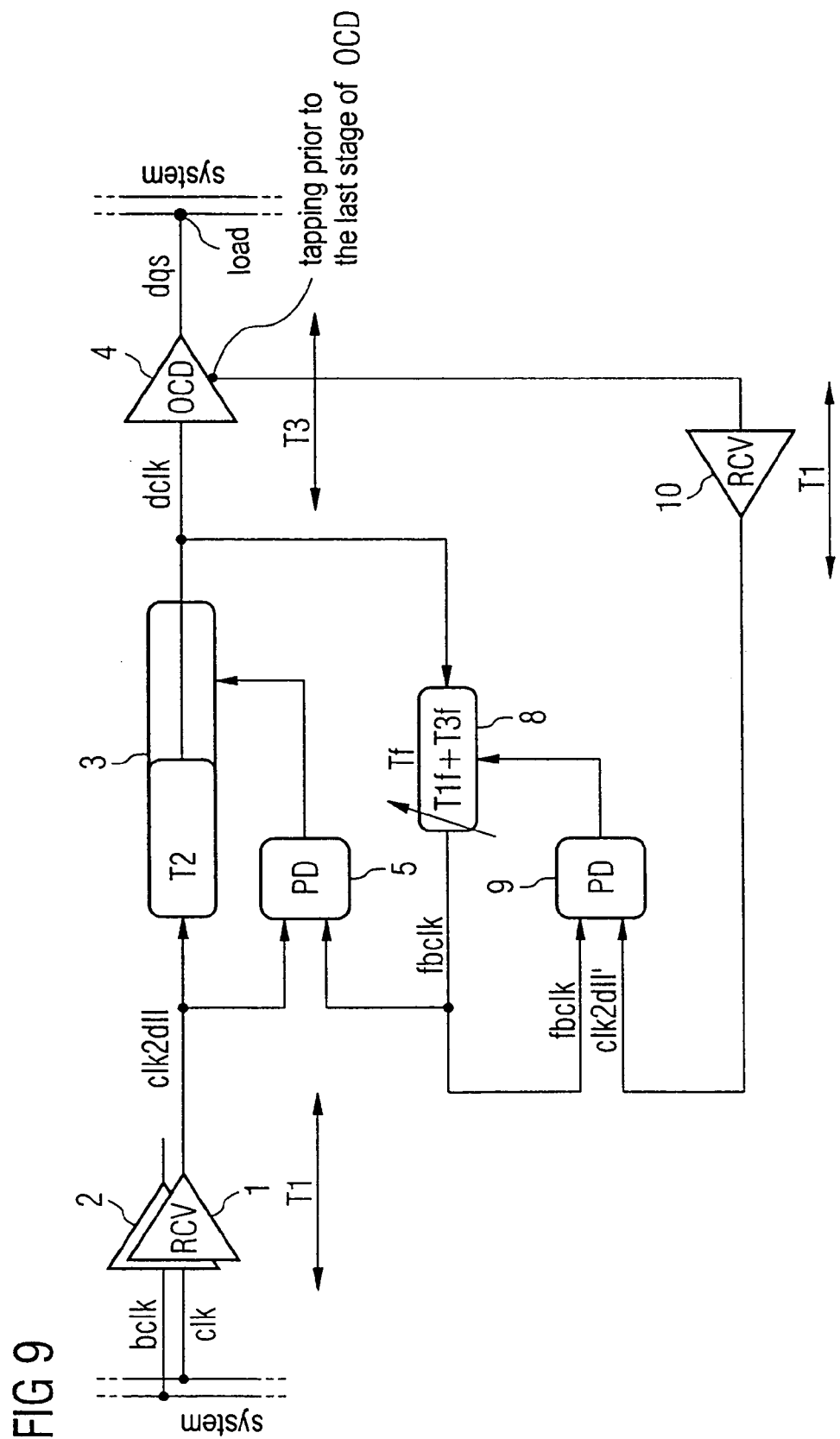
FIG. 9 is a block circuit diagram of a second embodiment of the second device for synchronizing clock signals in accordance with an aspect of the invention.

FIG. 9 shows a block circuit diagram of a second embodiment of the second device for synchronizing clock signals in accordance with the invention. With this solution, only the same modifications were performed in the embodiment illustrated in FIG. 8 that have already been described as modifications of the solution described in FIG. 5 in connection with FIG. 6. Therefore, this embodiment will not be dealt with in detail in the following.

The above-described first device for synchronizing clock signals, which was described in connection with FIGS. 5 and 6, comprises, as compared to the second device for synchronizing clock signals in accordance with the invention, which was described in connection with FIGS. 8 and 9, some minor advantages that may make the second device appear preferable. One disadvantage thus is that the DLL and, in particular, the second delay unit thereof, is positioned within the delay chain (see FIG. 11a) that determines the signal CLK2DLL'. By the DLL (in particular by modifications of the variable delay time of the second delay unit) and by jitters of the system clock, jitter is namely introduced which may have a negative influence on the stability of the control circuit since this jitter does not influence the signal CLK2DLL, too. A second problem is the latency time that occurs between the two clock signals CLK2DLL and CLK2DLL' that are compared by the second phase detector 9, by means of which a varying extent of jitter can be introduced by the external clock signal.

A particular advantage of the devices according to the invention as illustrated in FIGS. 8 and 9 is that the signals used during phase comparison in the second control loop are both derived from the signal DCLK and are thus both subject to the same jitter influences and that not, as with the devices illustrated in FIGS. 5 and 6, a different influence is exerted on the signals that are compared with respect to phases in the second control loop at PD9.

The devices according to the invention may, of course, also be employed with other uses (here memory chips) and circuits than those described, where the synchronizing of clock signals is an object.

Moreover, instead of the phase detectors described, other phase comparison unit enabling a phase comparison may also be used.

What is claimed is:

1. A device for synchronizing clock signals comprising:
   a first delay unit with variably controllable delay time, an input of the first delay unit being connected to an output of an input circuit having a first delay time, the input circuit receiving a first clock signal, wherein the first delay unit outputs at its output a second clock signal that is to be synchronized with the first clock signal;
   a second delay unit having a fixed delay time portion corresponding approximately to the first delay time, and an additional variably controllable delay time portion, and which is connected at its input to the output of the first delay unit;
   a first phase comparison unit, a first input of which is connected to the output of the input circuit, and a second input of which is connected to an output of the second delay unit, and an output signal of which controls the delay time of the first delay unit;
   a copy of the input circuit, an input of which is connected to the output of the first delay unit; and
   a second phase comparison unit, a first input of which is connected to the output of the input circuit, and a second input of which is connected to an output of the copy of the input circuit, and an output signal of which controls the variable delay time portion of the second delay unit.

2. The device according to claim 1, further comprising an output circuit with a further delay time, the output circuit being connected between the output of the first delay unit and the input of the copy of the input circuit, and outputting at its output the second clock signal that is to be synchronized with the first clock signal, wherein the fixed delay time portion of the second delay unit corresponds approximately to a sum of the first delay time and a further delay time.

3. The device according to claim 1, wherein the output at which the second clock signal is generated is connected to an ohm resistive and/or capacitive load.

4. The device according to claim 1, further comprising an output circuit with a further delay time, the output circuit including of one or a plurality of first circuit stages and one last circuit stage which outputs at its output the second clock signal and which is connected to a load, wherein the plurality of first circuit stages is connected between the output of the first delay unit and, by interconnecting a copy of the last circuit stage, the input of the copy of the input circuit, wherein the fixed delay time portion of the second delay unit corresponds approximately to the sum of the first delay time and a further delay time.

5. The device according to claim 1, the device being designed in the form of an integrated circuit chip.

6. The device according to claim 5, wherein the first clock signal originates from a device connected to the chip.

7. The device according to claim 6, wherein the second clock signal is output by the chip to the device.

8. The device according to claim 2, wherein the output circuit includes an off-chip-driver.

9. The device according to claim 1, wherein the input circuit includes a receiver.

10. The device according to claim 9, wherein the receiver includes a differential amplifier.

11. The device according to claim 1, wherein the first phase comparison unit and the second phase comparison unit each include a phase detector.

12. A semiconductor memory comprising a device according to any of claim 1.

13. The semiconductor memory according to claim 12, wherein the semiconductor memory is a DDR-SDRAM.

* * * * *